(12) United States Patent
Bettman

(10) Patent No.: US 6,486,701 B1
(45) Date of Patent: Nov. 26, 2002

(54) CPLD HIGH SPEED PATH

(75) Inventor: Roger Bettman, Los Altos, CA (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/617,601

(22) Filed: Jun. 12, 2000

(51) Int. Cl.[7] ............................................. H03K 19/173
(52) U.S. Cl. ............................................. 326/38; 326/47
(58) Field of Search ................................ 326/38–41, 47, 326/49, 37

(56) References Cited

U.S. PATENT DOCUMENTS 4,313,106 A * 1/1982 Hsu ...................... 365/185.17
4,745,579 A * 5/1988 Mead et al. ................ 365/104
4,930,097 A * 5/1990 Ledenbach et al. ......... 708/230

OTHER PUBLICATIONS

ALTERA, MAX 7000 Programmable Logic Device Family Data Sheet, Aug. 2000, ver. 6.02, pp. 1–85.

* cited by examiner

Primary Examiner—Michael Tokar
Assistant Examiner—James H Cho
(74) Attorney, Agent, or Firm—Christopher P. Maiorana, P.C.

(57) ABSTRACT

An apparatus comprises two or more memory elements connected in parallel and programmed alike, where the memory elements comprise a high speed path of a programmable logic device.

20 Claims, 3 Drawing Sheets

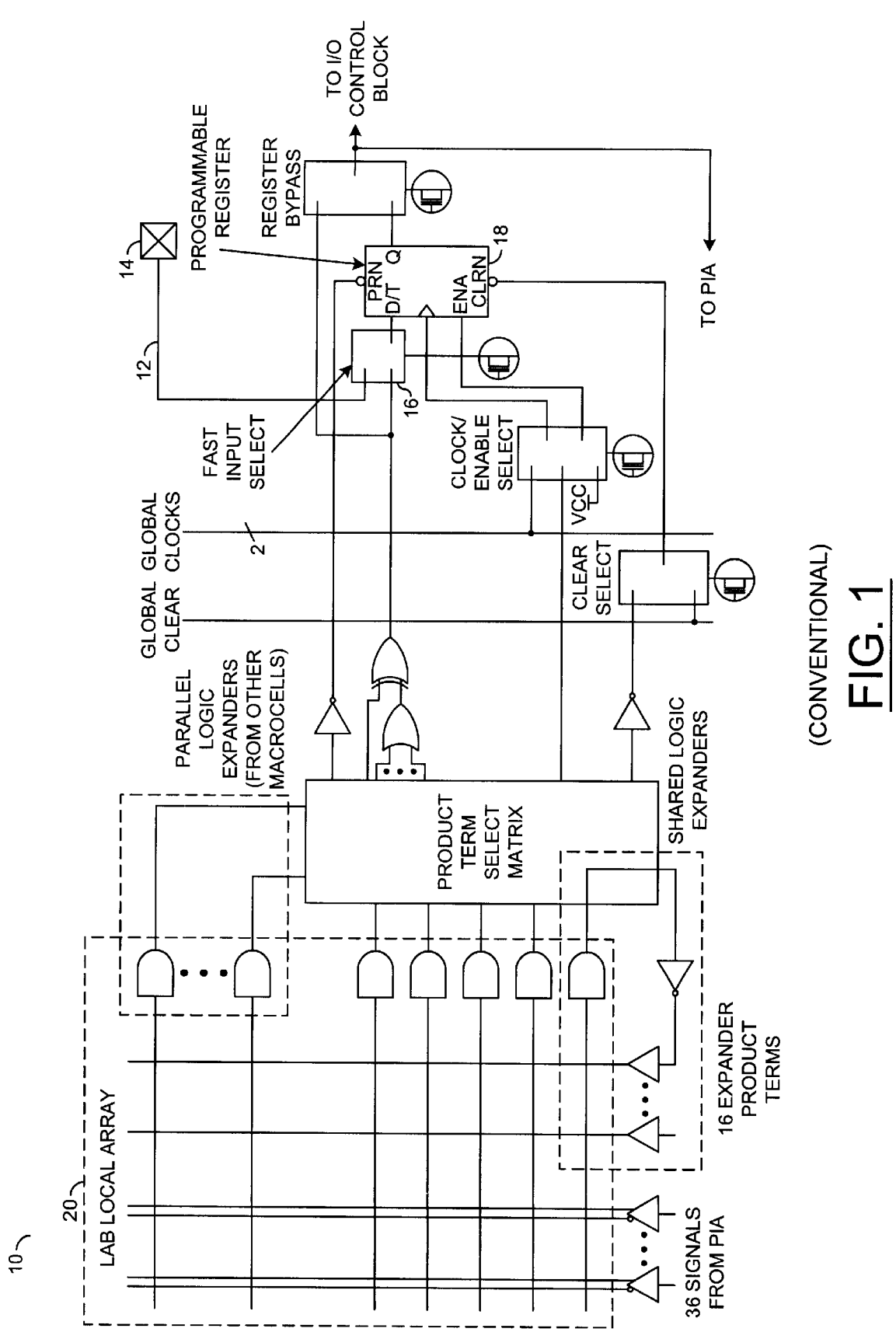
FIG. 1
(CONVENTIONAL)

CPLD HIGH SPEED PATH

FIELD OF THE INVENTION

The present invention relates to signal paths in programmable logic devices generally and, more particularly, to high speed paths in programmable logic devices.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a macrocell configured to generate a desired output in response to the sum-of-products terms. The sum-of-products terms can also be generated using programmable NOR-NOR logic.

In particular, such a macrocell may be programmed to operate in a combinatorial mode, where the output follows the input, delayed by the propagation delay of the macrocell. The macrocell may be further programmed to operate in a storage mode, where the output is a function of a clock signal (i.e., the macrocell output is synchronous with the clock signal). Moreover, other features available in connection with the operation of the macrocell, and which may be programmable, include the output polarity of the macrocell (i.e., whether the output is active high, or active low). The macrocell may be programmed to operate in the combinatorial mode or the storage mode, the storage mode including a latch mode, and a registered mode. In the registered mode, the macrocell may be programmed to operate as a flip-flop (e.g., a D-type flip-flop or a T-type flip-flop).

The AND plane of a PLD can be constructed using an array of memory cells arranged in rows and columns. Each of the plurality of inputs is presented to an input of the memory cells in a row. Each of the memory cells in a row is programmed to generate a signal in response to the particular input. An output of each of the memory cells in a column is connected to a sense amplifier. Each column of the array has a sense amplifier configured to generate one of the product terms in response to the signals generated by the memory cells in the column.

Referring to FIG. 1, a block diagram of a macrocell 10 illustrating a fast input path of a conventional PLD is shown. A PLD can have a fast input for implementing speed critical logic. The fast inputs are implemented separately from the AND plane inputs. For example, a fast input may be implemented by creating an alternative path that is shorter than the paths of other (i.e., normal) inputs. The macrocell 10 has a fast path 12 that connects an input pin 14 to a fast input select circuit 16, and a programmable register 18. The fast path 12 is separate from the inputs of an AND plane 20. Because the fast path 12 is separate from the AND plane 20, no logic functions can be performed on the fast input 14. Normal inputs connected to the macrocell 10 via the AND plane 20 can take full advantage of the logic capabilities of the AND plane. The macrocell 10 can be programmed for either the fast path or the normal combinatorial paths. Therefore, the fast path 14 requires a dedicated pin and a dedicated macrocell. In addition, the fast input provided by the macrocell 10 cannot provide an asynchronous fast input signal.

SUMMARY OF THE INVENTION

The present invention concerns an apparatus comprising two or more memory elements connected in parallel and programmed alike, where the memory elements comprise a high speed path of a programmable logic device.

The objects, features and advantages of the present invention include providing an architecture and/or method for implementing a high speed path in a programmable logic device that may (i) be built in a logic array by connecting an input to multiple non-volatile array cells, (ii) program multiple cells with identical data, (iii) produce more current to create a faster path than a normal input, (iv) use existing designs for non-volatile cells, (v) have lower R&D expenses for similar programming characteristics, (vi) fit in pitch with similar peripheral circuits, and/or (vii) provide same logic functions for high speed path and normal path.

BRIEF DESCRIPTION OF THE DRAWINGS

These and other objects, features and advantages of the present invention will be apparent from the following detailed description and the appended claims and drawings in which:

FIG. 1 illustrates a dedicated fast path in a programmable logic device;

DETAILED DESCRIPTION OF THE PREFERRED EMBODIMENTS

Figure 2:
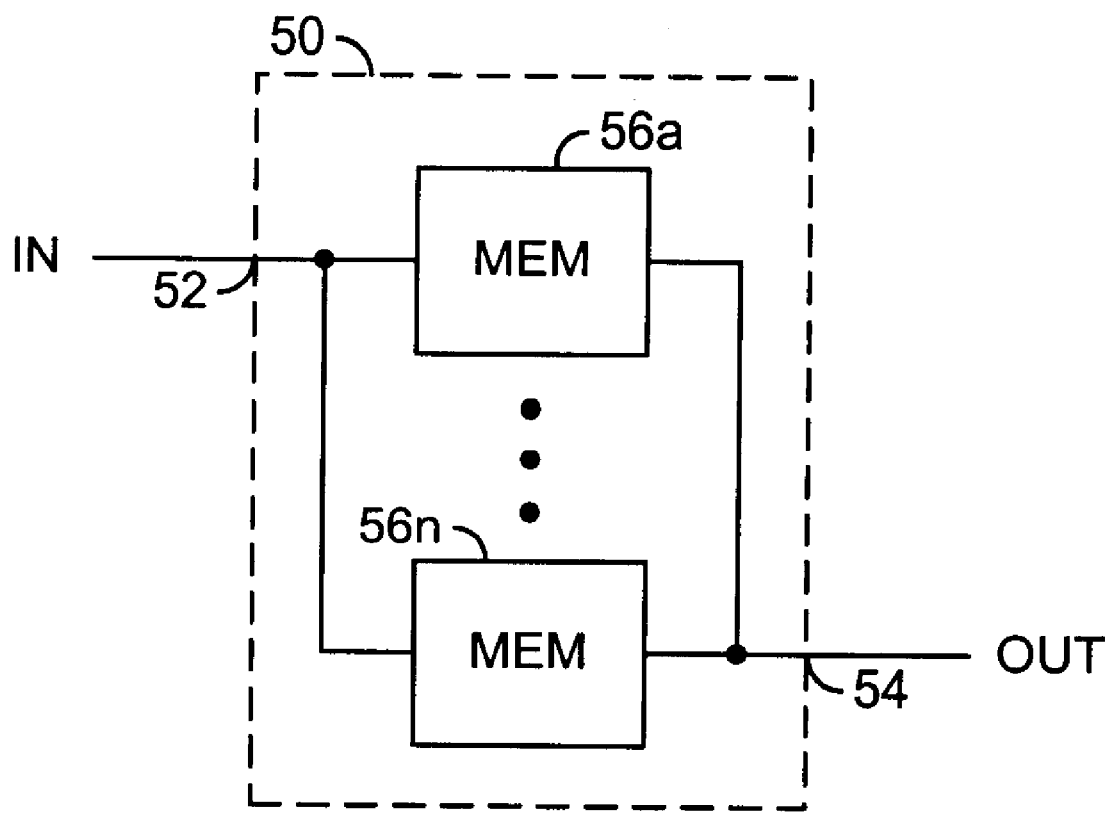
FIG. 2 illustrates a preferred embodiment of the present invention.

Referring to FIG. 2, a block diagram of a circuit 50 illustrating a preferred embodiment of the present invention is shown. The circuit 50 may be implemented, in one example, as a memory element of a high speed path of a programmable logic device (PLD). A high speed path may be defined as an input or set of inputs that may have a propagation delay that is faster (shorter) than inputs of a normal path of the PLD. The circuit 50 may have an input 52 that may receive a signal (e.g., IN) and an output 54 that may present a signal (e.g., OUT). The signal IN may be, in one example, an input term. The signal OUT may be used, in one example, to generate a product term.

The circuit 50 may comprise a plurality of memory cells 56a–56n. The memory cells 56a–56n may be of the same type as used to implement a normal path in the PLD. The plurality of memory cells 56a–56n may be connected in parallel and programmed alike. Forming a memory element by connecting multiple memory cells in parallel to the same input may provide a greater current sinking or sourcing capability. Sinking or sourcing more current may provide faster switching characteristics. By providing faster switching characteristics to path elements, a high speed path may be achieved. The circuit 50 may be implemented in many different technologies (e.g., $E^2$, flash, U.V., etc.).

Figure 3:
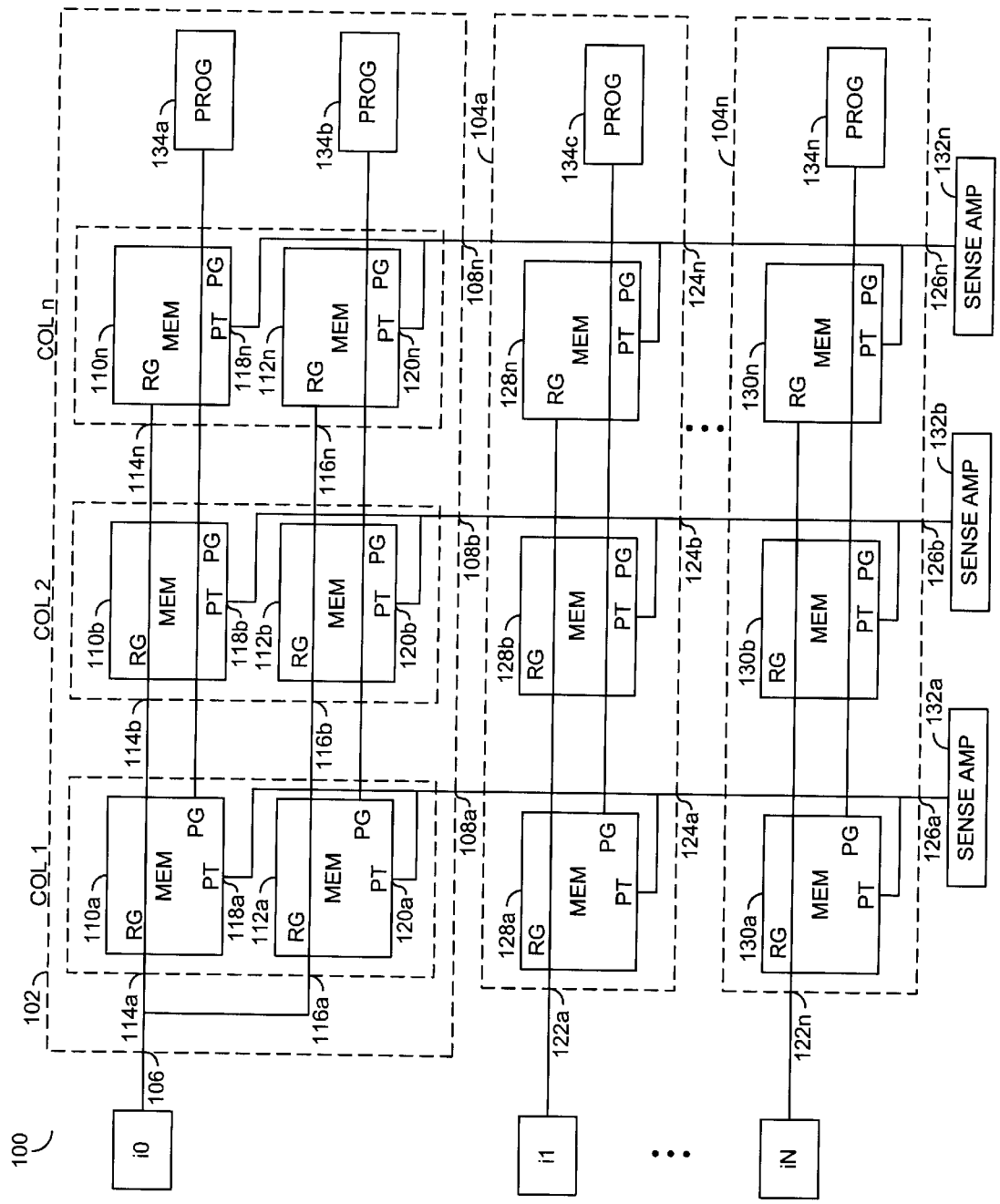
FIG. 3 illustrates a programmable logic device implemented in accordance with the present invention.

Referring to FIG. 3, a block diagram of a PLD 100 implemented in accordance with a preferred embodiment of the present invention is shown. The PLD 100 may be implemented as a programmable logic device (PLD) having a high speed path 102. The high speed path 102 may be used, in one example, to implement a portion of logic that is speed critical. The PLD 100 may have more than one high speed path, as well as a number of normal paths 104a–104n.

The high speed path 102 may have an input 106 and a number of outputs 108a–108n. The path 102 may comprise a number of memory cells arranged in a number of rows and a number of columns. In one example, the number of rows may be two. For example, a number of memory cells 110a–110n may be arranged to form a first row and a number of memory cells 112a–112n may be arranged to form a second row. A signal (e.g., I0) may be presented to the input 106. The input 106 may be connected to an input 114a–114n and 116a–116n of the memory cells 110a–110n and 112a–112n, respectively. The memory cells 110a–110n and 112a–112n may be connected together to form columns that may present signals to the outputs 108a–108n. For example, an output 118a of the memory cell 110a and an output 120a of the memory cell 112a may be connected to the output 108a. An output 118b of the memory cell 110b and an output 120b of the memory cell 112b may be connected to the output 108b. Other columns are generally connected similarly. Each of the memory cells in a column (e.g., 110a and 112a, 110b and 112b, etc.) may be programmed alike.

Each of the normal paths 104a–104n may have an input 122a–122n that may receive a signal (e.g., I1–In) and a number of outputs 124a–124n and 126a–126n, respectively. Each of the normal paths 104a–104n generally comprise a single row of memory cells (e.g., 128a–128n, 130a–130n, etc.). In the normal path, a column generally contains a single memory cell. The inputs 122a–122n of the normal paths 104a–104n are generally connected to an input of each memory cell of the corresponding path 104a–104n. Each of the outputs 124a–124n and 126a–126n of the normal paths 104a–104n is generally connected to an output of a single memory cell.

The outputs of each column (e.g., 108i, 124i, and 126i) are generally connected to a sense amplifier 132a–132n. Each of the sense amplifiers 132a–132n may be configured to generate an output signal in response to the inputs 106 and 122a–122n and the programming of the memory cells of a particular column. The output signal may be, in one example, a product term. The memory cells of the PLD 100 may be programmed, in one example, using a number of programming circuits 134a–134n.

The present invention generally provides a method for implementing a fast input or group of fast inputs in an AND plane of a programmable logic device. The fast input(s) may (i) be created without requiring additional types of memory cells and (ii) provide the same logic functions available for the normal inputs.

The present invention may have an advantage of providing high speed paths with logic capabilities similar to the normal paths. The memory cells used for the fast path may be the same as the memory cells in the normal path. Implementing a fast path in accordance with the present invention generally requires no new development or characterization of memory cells. The present invention may implement a high speed path in a PLD using multiple memory cells without sacrificing I/O pins.

In an alternative embodiment, a high speed path may be implemented using a single memory cell configured to provide more current than the memory cells of the normal paths.

A high speed path in accordance with the present invention may be added to any programmable logic device that uses a memory array structure to implement an AND-OR function.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    two or more memory elements having inputs and outputs connected in parallel and programmed alike, wherein said two or more memory elements comprise a high speed path of a programmable logic device.

2. The apparatus according to claim 1, further comprising:
    a normal speed path comprising a single memory element.

3. The apparatus according to claim 2, wherein said high speed path has a propagation delay that is faster than a propagation delay of said normal speed path.

4. A programmable logic device comprising one or more apparatus according to claim 1.

5. The apparatus according to claim 1, further comprising a sense amplifier.

6. The apparatus according to claim 5, wherein said sense amplifier generates a product term.

7. The apparatus according to claim 1, wherein an input term is presented to an input of each of said memory elements.

8. The apparatus according to claim 1, wherein said high speed path implements a speed critical logic portion of said programmable logic device.

9. The apparatus according to claim 1, wherein said memory elements comprise non-volatile memory cells.

10. The apparatus according to claim 9, wherein said memory cells are implemented using $E^2$, Flash, or U.V. technology.

11. An AND-OR plane of a programmable logic device comprising one or more apparatus according to claim 1.

12. An apparatus comprising:
    means for programming two or more memory elements alike; and
    means for connecting inputs and outputs of said two or more memory elements in parallel, wherein said memory elements comprise a high speed path of a programmable logic device.

13. A method for constructing a high speed path in a programmable logic device comprising the steps of:
    (A) connecting inputs and outputs of two or more memory elements in parallel; and
    (B) programming said memory elements alike.

14. The method according to claim 13, wherein said memory elements comprise an AND-OR plane of said programmable logic device.

15. The method according to claim 13, further comprising the steps of:
    (C) presenting an input signal to an input of said two or more memory elements.

16. The method according to claim 15, further comprising the steps of:
    (D) sensing an output signal from said two or more memory elements.

17. The method according to claim 13, wherein connecting said memory elements in parallel provides a propagation delay that is faster than a normal path of the programmable logic device.

18. The method according to claim 13, wherein said high speed path implements a speed critical logic portion of said programmable logic device.

19. The method according to claim 13, wherein said memory elements comprise non-volatile memory cells.

20. The method according to claim 19, wherein said memory cells are implemented using $E^2$, Flash, or U.V. technology.

* * * * *